(12) United States Patent
Liu

(10) Patent No.: US 9,167,729 B2
(45) Date of Patent: Oct. 20, 2015

(54) INVERTER, SEALING AIR DUCT AND HEAT DISSIPATION SYSTEM

(71) Applicant: Huawei Technologies Co., Ltd., Shenzhen (CN)

(72) Inventor: Xiaohu Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 105 days.

(21) Appl. No.: 14/012,659

(22) Filed: Aug. 28, 2013

(65) Prior Publication Data

US 2013/0343110 A1    Dec. 26, 2013

Related U.S. Application Data

(63) Continuation of application No. PCT/CN2012/075813, filed on May 21, 2012.

(30) Foreign Application Priority Data

Oct. 18, 2011   (CN) .......................... 2011 1 0316799

(51) Int. Cl.
*H05K 7/20* (2006.01)
*H02M 7/00* (2006.01)

(52) U.S. Cl.
CPC ........... *H05K 7/20909* (2013.01); *H02M 7/003* (2013.01); *H05K 7/209* (2013.01); *H05K 7/20918* (2013.01)

(58) Field of Classification Search
USPC ........................ 361/679.46–679.54, 688–723;
165/80.2–80.3; 454/184; 363/141;
257/712–713, 717, 721–722;
174/547–548, 16.3
See application file for complete search history.

(56) References Cited

U.S. PATENT DOCUMENTS 5,091,823 A * 2/1992 Kanbara et al. ................ 361/697
7,672,115 B2 * 3/2010 Victor et al. ................... 361/625

(Continued)

FOREIGN PATENT DOCUMENTS

| CN | 201167281 Y | 12/2008 |
|---|---|---|
| CN | 101546942 A | 9/2009 |
| EP | 0099092 A1 | 1/1984 |
| WO | WO 2012108398 A1 * | 8/2012 |

(Continued)

OTHER PUBLICATIONS

Foreign Communication From a Counterpart Application, European Application No. 12841538 7 Extended European Search Report dated Jan. 8, 2015, 6 pages.

(Continued)

*Primary Examiner* — Zachary M Pape
(74) *Attorney, Agent, or Firm* — Conley Rose, P.C.; Grant Rodolph

(57) ABSTRACT

An inverter, a sealing air duct, and a heat dissipation system are disclosed. The inverter includes: an enclosure having a first cavity and a second cavity that are isolated from each other and sealed; a magnetic conversion circuit including magnetic elements that is arranged in the first cavity; a power conversion circuit including power tubes that is arranged in the second cavity; a heatsink arranged at the bottom of the enclosure and located outside the first cavity and the second cavity; a sealing air duct arranged outside the second cavity, where the columnar pipeline is sealed at two ends, the bottom surface is formed by a side wall of the second cavity or a substrate of the heatsink, and the bottom surface includes an air inlet and an air outlet to communicate with the second cavity and the at least one columnar pipeline.

12 Claims, 10 Drawing Sheets

(56) References Cited

U.S. PATENT DOCUMENTS

| | | | |
|---|---|---|---|
| 7,729,115 B2 * | 6/2010 | Hall et al. | 361/695 |
| 8,767,401 B2 * | 7/2014 | Kim et al. | 361/697 |
| 2002/0141159 A1 * | 10/2002 | Bloemen | 361/704 |
| 2010/0202109 A1 | 8/2010 | Zheng et al. | |
| 2010/0302728 A1 * | 12/2010 | Knaup et al. | 361/690 |
| 2011/0069451 A1 * | 3/2011 | Hobein et al. | 361/695 |
| 2011/0222244 A1 * | 9/2011 | Takashiro et al. | 361/704 |
| 2013/0240233 A1 * | 9/2013 | Kwon | 174/50 |

FOREIGN PATENT DOCUMENTS

| | | | |
|---|---|---|---|
| CN | 201690342 U | 12/2010 | |
| CN | 101546942 B | 3/2011 | |
| CN | 201878034 U | 6/2011 | |
| CN | 201894040 U | 7/2011 | |
| CN | 201956921 U | 8/2011 | |
| CN | 102355149 A | 2/2012 | |

OTHER PUBLICATIONS

Foreign Communication of a Counterpart Application, PCT Application No. PCT/CN2012/075813, Chinese Search Report dated Aug. 30, 2012, 8 pages.

Foreign Communication of a Counterpart Application, PCT Application No. PCT/CN2012/075813, Chinese Written Opinion dated Aug. 30, 2012, 5 pages.

Foreign Communication of a Counterpart Application, PCT Application No. PCT/CN2012/075813, English Translation of Chinese Search Report dated Aug. 30, 2012, 3 pages.

Foreign Communication From a Counterpart Application, Chinese Application No. 201110316799.1 Chinese Search Report dated Dec. 25, 2013, 2 pages.

Foreign Communication From a Counterpart Application, Chinese Application No. 201110316799.1 Chinese Office Action dated Jan. 3, 2014, 5 pages.

* cited by examiner

INVERTER, SEALING AIR DUCT AND HEAT DISSIPATION SYSTEM

CROSS-REFERENCE TO RELATED APPLICATIONS

This application is a continuation of International Application No. PCT/CN2012/075813, filed on May 21, 2012, which claims priority to Chinese Patent Application No. 201110316799.1, filed on Oct. 18, 2011, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of electronic components, and in particular, to an inverter, a sealing air duct and a heat dissipation system in the field of electronic devices.

BACKGROUND

Heat consumption of a photovoltaic inverter mainly originates from a magnetic conversion circuit and a power conversion circuit. The magnetic conversion circuit generally includes a boost inductor and an inverter inductor. The magnetic conversion consumes a large quantity of heat, causes a high temperature, and is generally arranged at the top of the inverter. The heat generated by magnetic devices is directly transferred to the substrate of a heatsink and is dissipated through split radiation fins arranged at the top. The heat consumption of the power conversion circuit mainly originates from boost power tubes and inverter power tubes, consuming a large quantity of heat. Most of the heat consumption is directly dissipated through the heatsink. However, the remaining heat causes the air temperature inside the inverter to rise, consequently affecting the reliability and life cycle of temperature-sensitive devices such as electrolytic capacitors and a Liquid Crystal Display (LCD).

Most photovoltaic inverters use the casted and profile heatsink for heat dissipation. Therefore, only the temperature of power devices is reduced, but the air temperature inside a cavity fails to be reduced. Accordingly, to reduce the air temperature inside the cavity, generally, the size of the heatsink needs to be enlarged and the air volume needs to be increased. This increases the weight, size and noise of the inverter.

Therefore, a solution is desired for effectively reducing the air temperature inside the cavity and improving the heat dissipation efficiency.

SUMMARY

Embodiments of the present invention provide an inverter, a sealing air duct and a heat dissipation system, capable of reducing air temperature inside a cavity and improving heat dissipation efficiency.

In one aspect, an embodiment of the present invention provides an inverter. The inverter includes: an enclosure having a first cavity and a second cavity that are isolated from each other and sealed; a magnetic conversion circuit including magnetic elements that is arranged in the first cavity; a power conversion circuit including power tubes that is arranged in the second cavity; a heatsink arranged at the bottom of the enclosure and located outside the first cavity and the second cavity; a sealing air duct arranged outside the second cavity, where the sealing air duct includes at least one columnar pipeline formed by a heat dissipation surface and a bottom surface, the at least one columnar pipeline is sealed at two ends, the bottom surface is formed by a side wall of the second cavity or a substrate of the heatsink, and the bottom surface includes an air inlet and an air outlet to communicate with the second cavity and the at least one columnar pipeline.

In another aspect, an embodiment of the present invention provides a sealing air duct. The sealing air duct is arranged outside a sealed cavity and includes at least one columnar pipeline formed by a heat dissipation surface and a bottom surface, where the at least one columnar pipeline is sealed at two ends, the bottom surface is formed by the wall of the sealed cavity, and the bottom surface includes an air inlet and an air outlet to communicate with the cavity and the at least one columnar pipeline.

In still another aspect, an embodiment of the present invention provides a heat dissipation system. The heat dissipation system includes: a heatsink arranged at the bottom of a sealed cavity and located outside the sealed cavity; and a sealing air duct according to an embodiment of the present invention. The sealing air duct is arranged outside a sealed cavity and includes at least one columnar pipeline formed by a heat dissipation surface and a bottom surface, where the at least one columnar pipeline is sealed at two ends, the bottom surface is formed by the wall of the sealed cavity, and the bottom surface includes an air inlet and an air outlet to communicate with the cavity and the at least one columnar pipeline.

Based on the above technical solutions, according to the inverter, the sealing air duct and the heat dissipation system provided in the embodiments of the present invention, a sealing air duct having an air inlet and an air outlet is arranged outside a sealed cavity so that the hot air inside the sealed cavity enters the sealing air duct and exchanges heat with outside air through the heat dissipation surface of the sealing air duct, thereby reducing the air temperature inside the cavity, improving the heat dissipation efficiency, enhancing the reliability and life cycle of the devices, reducing product size and weight, and reducing the product noise.

BRIEF DESCRIPTION OF THE DRAWINGS

To describe the technical solutions in the embodiments of the present invention clearly, the following briefly describes the accompanying drawings required for illustrating the embodiments of the present invention. Apparently, the accompanying drawings described in the following description illustrate only some embodiments of the present invention, and a person skilled in the art may derive other accompanying drawings based on these accompanying drawings without creative efforts.

DETAILED DESCRIPTION

The following describes the technical solutions in the embodiments of the present invention clearly and completely with reference to the accompanying drawings in the embodiments of the present invention. Apparently, the described embodiments are merely a part rather than all of the embodiments of the present invention. All other embodiments obtained by a person skilled in the art based on the embodiments in the present invention without creative efforts shall fall within the protection scope of the present invention.

Figure 1A:
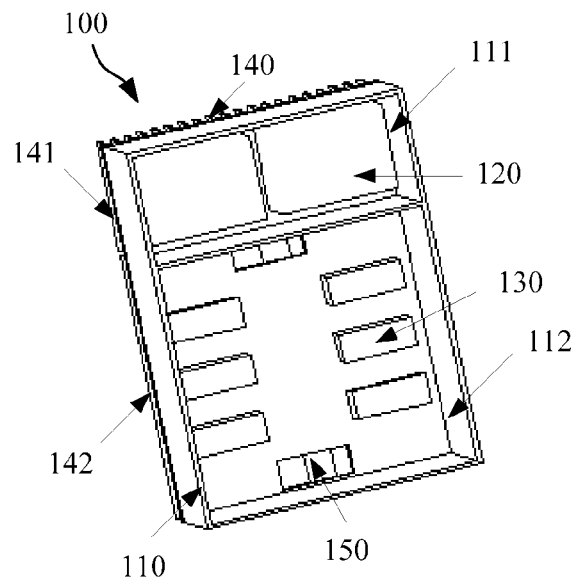
FIG. 1A and FIG. 1B are schematic perspective diagrams of an inverter according to an embodiment of the present invention.
Figure 1B:
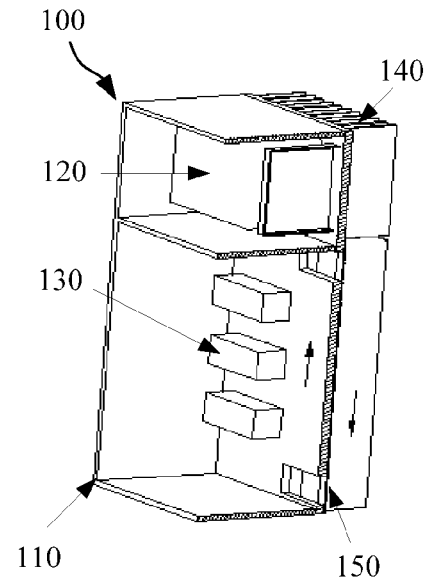

FIG. 1A and FIG. 1B are schematic perspective diagrams of an inverter according to an embodiment of the present invention. As shown in FIG. 1A and FIG. 1B, the inverter according to an embodiment of the present invention includes: an enclosure having a first cavity and a second cavity that are isolated from each other and sealed; a magnetic conversion circuit including magnetic elements that is arranged in the first cavity; a power conversion circuit including power tubes that is arranged in the second cavity; a heatsink arranged at the bottom of the enclosure and located outside the first cavity and the second cavity; a sealing air duct arranged outside the second cavity, where the sealing air duct includes at least one columnar pipeline formed by a heat dissipation surface and a bottom surface, the at least one columnar pipeline is sealed at two ends, the bottom surface is formed by a side wall of the second cavity or a substrate of the heatsink, and the bottom surface includes an air inlet and an air outlet to communicate with the second cavity and the at least one columnar pipeline.

Specifically, as shown in FIG. 1A and FIG. 1B, an inverter 100 includes: an enclosure 110, a magnetic conversion circuit 120 including magnetic elements, a power conversion circuit 130 including power tubes, a heatsink 140, and a sealing air duct 150. The enclosure 110 has a first cavity 111 and a second cavity 112 that are isolated from each other and sealed; the magnetic conversion circuit 120 is arranged in the first cavity 111; the power conversion circuit 130 is arranged in the second cavity 112; the heatsink 140 is arranged at the bottom of the enclosure 110 and located outside the first cavity 111 and the second cavity 112; the sealing air duct 150 is arranged outside the second cavity 112, and the sealing air duct 150 includes at least one columnar pipeline formed by a heat dissipation surface and a bottom surface; the at least one columnar pipeline is sealed at two ends, the bottom surface is formed by the side wall of the second cavity or the substrate of the heatsink, and the bottom surface includes an air inlet and an air outlet to communicate with the second cavity 112 and the at least one columnar pipeline.

Therefore, according to the inverter provided in the embodiments of the present invention, a sealing air duct having an air inlet and an air outlet is arranged outside a sealed cavity so that the hot air inside the sealed cavity enters the sealing air duct and exchanges heat with outside air through the heat dissipation surface of the sealing air duct, thereby reducing the air temperature inside the cavity, improving the heat dissipation efficiency, enhancing the reliability and life cycle of the devices, reducing product size and weight, and reducing the product noise.

It should be understood that the inverter according to the embodiment of the present invention is described only by using an inverter 100 as shown in FIG. 1A and FIG. 1B as an example, and the inverter according to the embodiments of the present invention are not limited thereto. For example, the inverter may have a plurality of sealed cavities. The sealed cavities may be isolated from each other using insulation plates or isolated using sealed cavities. It should also be understood that, in the embodiments of the present invention, the bottom of the enclosure of the inverter may be formed by the substrate of the heatsink. That is, the substrate of the heatsink forms bottom surfaces or bottoms of the first cavity and the second cavity.

It should be understood that the circuit including the magnetic elements in the embodiments of the present invention is referred to as a magnetic conversion circuit, and the circuit including the power tubes is referred to as a power conversion circuit; and in addition, the magnetic conversion circuit and the power conversion circuit may also include other electronic components. Alternatively, the magnetic elements include a boost inductor and an inverter inductor; and the power tubes include a boost power tube and an inverter power tube. It should also be understood that the embodiments of the present invention only use a photovoltaic inverter including a boost inductor, an inverter inductor, a boost power tube and an inverter power tube as an example for description. However, the embodiments of the present invention are not limited thereto. For example, the embodiments of the present invention may also be applicable to a Radio Remote Unit (RRU).

Figure 2:
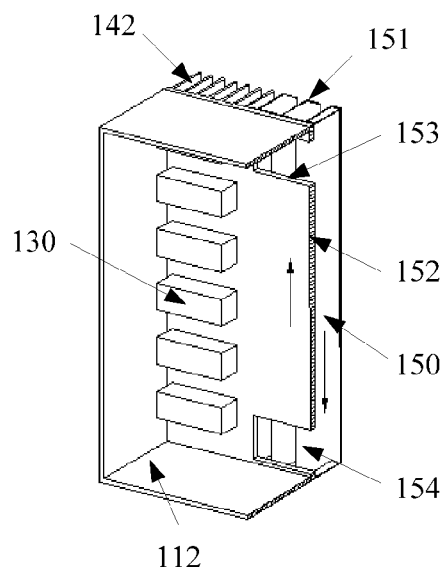
FIG. 2 is a partial schematic perspective diagram of an inverter according to an embodiment of the present invention.

In the embodiments of the present invention, as shown in FIG. 2, a sealing air duct 150 is arranged outside a second cavity 112, and the sealing air duct 150 includes at least one columnar pipeline formed by a heat dissipation surface 151 and a bottom surface 152; the at least one columnar pipeline is sealed at two ends, the bottom surface 152 may be formed by a side wall of the second cavity 112 or the substrate of a heatsink 140, and the bottom surface 152 includes an air inlet 153 and an air outlet 154 to communicate with the second cavity 112 and the at least one columnar pipeline of the sealing air duct 150. In this way, the hot air inside the sealed second cavity 112 enters the sealing air duct 150 and exchanges heat with outside air through the heat dissipation surface 151 of the sealing air duct 150, thereby reducing the air temperature inside the second cavity 112.

In the embodiment of the present invention, the heat dissipation surface 151 of the sealing air duct 150 is a wrinkled wall. The cross-section of the heat dissipation surface 151 may be in a contiguous boss shape. Each boss may be a regular polygon or an irregular polygon. For example, the heat dissipation surface 151 may be a series of square bosses. The spacing between the bosses may be designed according to requirements. The cross-section of the heat dissipation surface 151 may also be in a sawtooth shape or a ripple wave shape.

It should be understood that the cross-section of the heat dissipation surface 151 may be in other shapes. It should also be understood that the outer surface of the heat dissipation surface may also include a plurality of bosses to enlarge the contact area of the heat dissipation surface with the outside air and therefore enhance the heat dissipation effect.

In the embodiments of the present invention, it should also be understood that the bottom surface 152 of the sealing air duct 150 includes the air inlet 153 and the air outlet 154. The air inlet or the air outlet may be an opening transversally crossing a plurality of columnar pipelines, or one or more openings on the at least one columnar pipeline. The opening may be an opening on the bottom surface of one columnar pipeline, or an opening transversally crossing a plurality of columnar pipelines. The embodiments of the present invention are not limited thereto. The only requirement is that the air in the second cavity 112 flows through the air inlet 153 and the air outlet 154 and is capable of communicating with at least one columnar pipeline of the sealing air duct 150 to form a circulation passage for the inside air.

Therefore, with the technical solutions according to the embodiments of the present invention, the inside air temperature is reduced by at least 10° C. as compared with the prior art. This effectively reduces the requirements of the air heat dissipation for the heat dissipation area, reduces the size and weight of the heatsink, and improves the thermal power density of the photovoltaic inverter by over 20%. For products with the same size, a 10% reduction of the inside air temperature as compared with the prior art signifies that the working environment temperature of the power devices is lower and the reliability and life cycle of the devices are greatly enhanced. In addition, with an improvement on the heat dissipation ability of the product, passive heat dissipation within a higher power range may be implemented. Moreover, even if fans are added, the fans do not need to run at a high speed. Mostly, the fans run at a low speed or do not run, thereby remarkably reducing the noise of the inverter.

Figure 3:
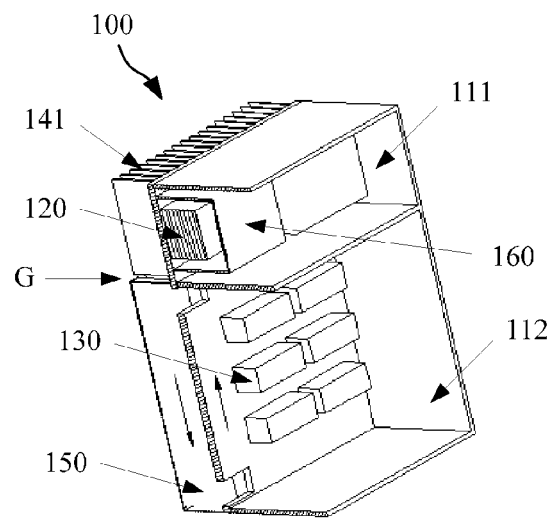
FIG. 3 is a partial schematic perspective diagram of an inverter according to another embodiment of the present invention.

In the embodiments of the present invention, as shown in FIG. 1A or FIG. 3, the heatsink 140 includes a first heatsink 141 located outside the first cavity 111 and a second heatsink located outside the second cavity 112. The radiation fins of a first heatsink 141 are isolated from the radiation fins of the second heatsink 142, as shown by the arrow G in FIG. 3. To be specific, the heat of a magnetic conversion circuit 120 is dissipated using the independent first heatsink 141, and the heat of a power conversion circuit 130 is dissipated using the independent second heatsink 142. The radiation fins of the first heatsink 141 are isolated from the radiation fins of the second heatsink 142, that is, thermal insulation is achieved, thereby preventing the heat generated by the magnetic conversion circuit 120 from being transferred to the power conversion circuit 130 and preventing the impact on the devices in the power conversion circuit 130.

It should be understood that, in the embodiments of the present invention, alternatively, the magnetic conversion circuit 120 is set to a substrate tightly adhering to the first heatsink 141, and the power conversion circuit 130 is set to a substrate tightly adhering to the second heatsink 142. This ensures that the heat generated by the elements and devices in the circuit is transferred through the substrate of the heatsink to the radiation fins of the heatsink, thereby improving the heat dissipation efficiency and enhancing the reliability and life cycle of the product.

To further prevent the impact on the power conversion circuit caused by the heat generated by the magnetic conversion circuit, the inverter 100 according to the embodiments of the present invention may further include a heat shield 160. The heat shield 160 is made of thermal insulation materials and is placed above the magnetic conversion circuit 120, as shown in FIG. 3. In this way, heat cascading to the power conversion circuit caused by the magnetic conversion circuit can be further prevented.

Alternatively, in the embodiments of the present invention, according to application requirements, the inverter further includes a first fan arranged inside the second cavity and/or a second fan arranged outside the enclosure. For example, the first fan is arranged inside the second cavity, speeding up air circulation and air temperature reduction inside the second cavity and improving the heat dissipation efficiency.

It should be understood that the term "and/or" in this document is only an association relationship for describing associated objects and represents that three relationships may exist, for example, A and/or B may represent the following three cases: A exists separately, both A and B exist, and B exists separately. In addition, the character "/" in this document usually represents that the former and later associated objects are in an "or" relationship.

It should be understood that the heatsink may be an integrated structure or combinatorial structure. The heatsink with an integrated structure may be formed by extrusion or casting. The heatsink with a combinatorial structure may be formed by compression joint with substrates and fins or formed by welding and adhesion. The material of the heatsink may be metal or non-metal.

Therefore, according to the inverter provided in the embodiments of the present invention, a sealing air duct having an air inlet and an air outlet is arranged outside a sealed cavity so that the hot air inside the sealed cavity enters the sealing air duct and exchanges heat with external air through the heat dissipation surface of the sealing air duct, thereby reducing the air temperature inside the second cavity, improving the heat dissipation efficiency, enhancing the reliability and life cycle of the devices, reducing product size and weight, and reducing the product noise.

Figure 4A:
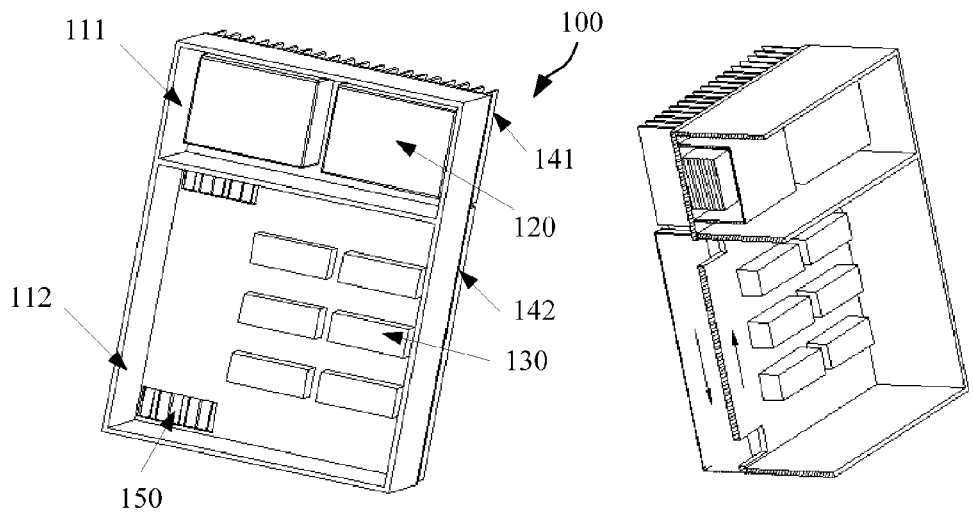
FIG. 4A to FIG. 4C are schematic perspective diagrams of an inverter according to another embodiment of the present invention.
Figure 4B:
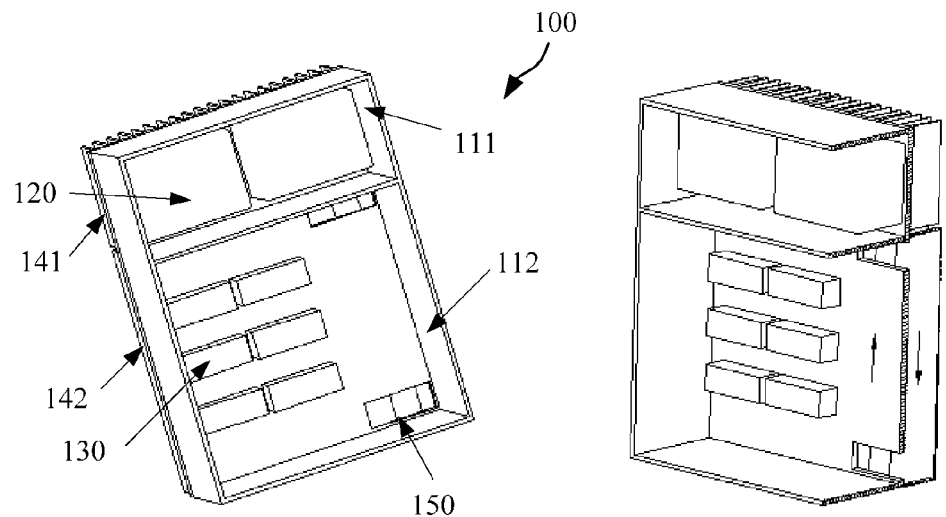
Figure 4C:
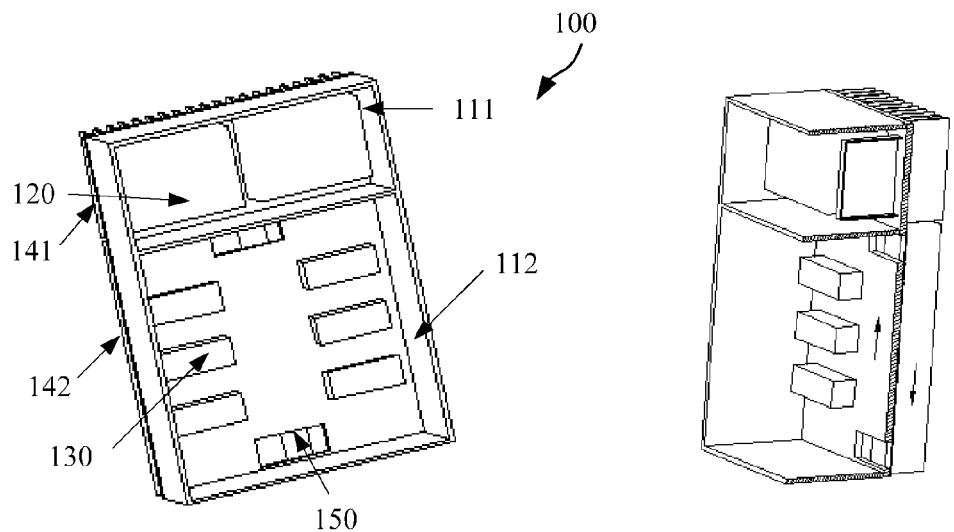
Figure 5A:
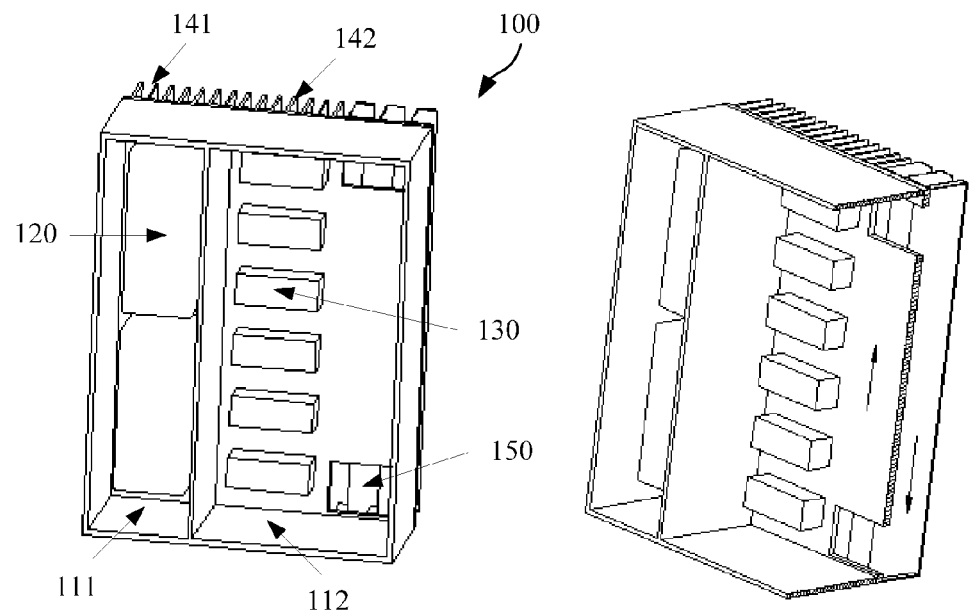
FIG. 5A to FIG. 5C are schematic perspective diagrams of an inverter according to another embodiment of the present invention.
Figure 5B:
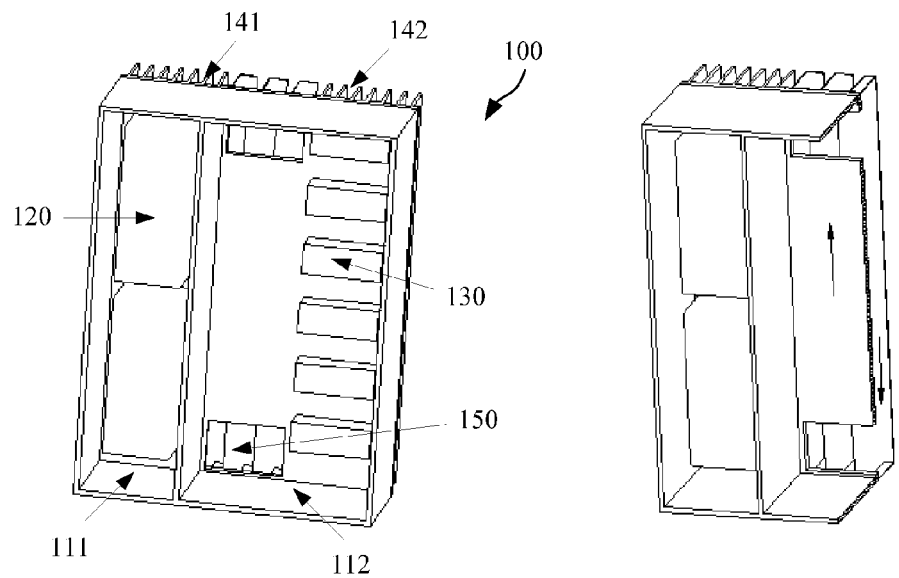
Figure 5C:
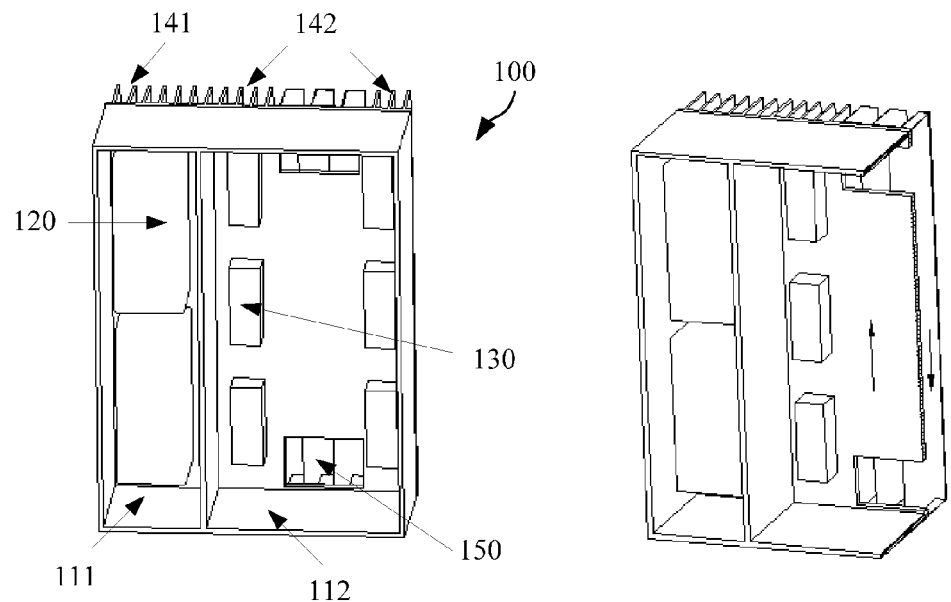
Figure 6A:
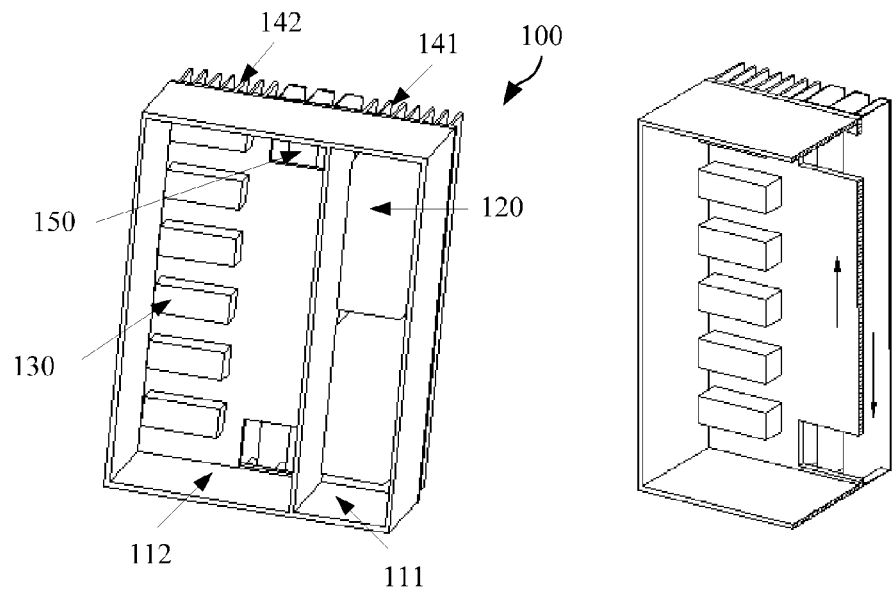
FIG. 6A to FIG. 6C are schematic perspective diagrams of an inverter according to another embodiment of the present invention.
Figure 6B:
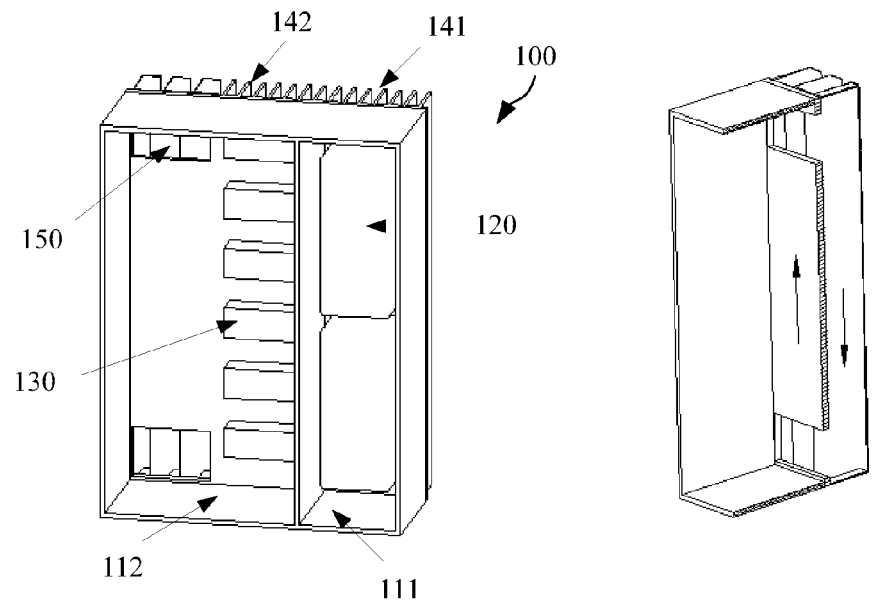
Figure 6C:
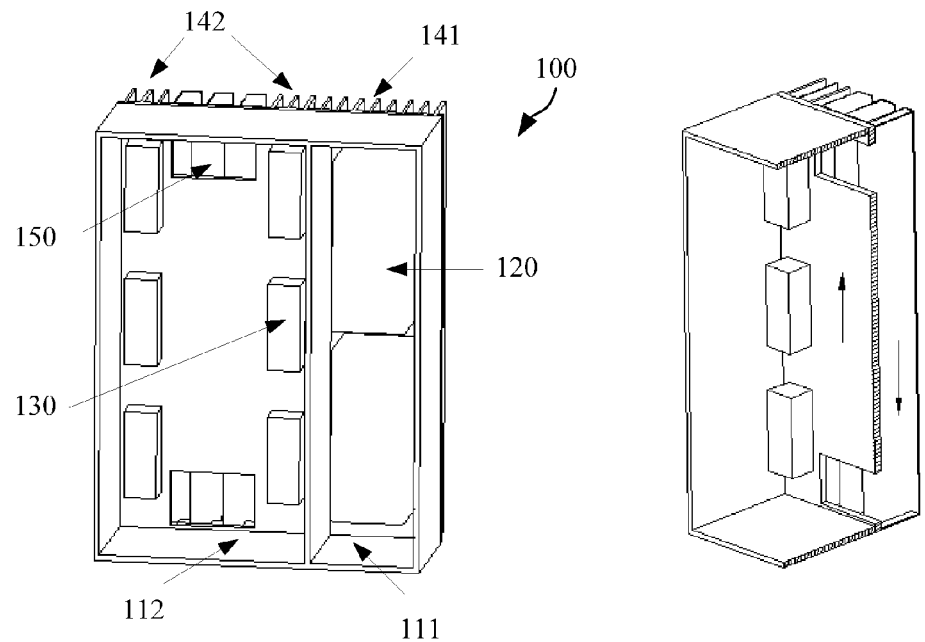

In the embodiments of the present invention, as shown in FIG. 4A to FIG. 4C, preferably the first cavity 111 may be located at the top of the entire inverter. That is, the first cavity 111 is arranged above the second cavity 112 to prevent rise of heat air flow from the first cavity from affecting the temperature of the second cavity as much as possible. As shown in FIG. 5A to FIG. 5C, the first cavity 111 may be located on the left side of the second cavity 112. As shown in FIG. 6A to FIG. 6C, the first cavity 111 may be located on the right side of the second cavity 112. As shown in FIG. 7A to FIG. 7D, the first cavity 111 may be located in the middle of the second cavity 112. That is, the first cavity may be located above, on the left side, on the right side or in the middle of the second cavity.

In the embodiments of the present invention, alternatively, the sealing air duct is located on the substrate of the second heatsink and is located on the left side, in the middle or on the right side of the second heatsink.

Specifically, as shown in FIG. 4A, the first cavity 111 is located above the second cavity 112, and the sealing air duct 150 is arranged on the substrate of the second heatsink 142 and located on the left side of the second heatsink 142. That is, the air inlet and the air outlet of the sealing air duct 150 are arranged on the left side of the power conversion circuit 130. As shown in FIG. 4B, the air inlet and the air outlet of the sealing air duct 150 are arranged on the right side of the power conversion circuit 130. That is, the sealing air duct 150 is arranged on the substrate of the second heatsink 142 and located on the right side of the second heatsink 142. As shown in FIG. 4C, the sealing air duct 150 is arranged on the substrate of the second heatsink 142 and located in the middle of the second heatsink 142.

As shown in FIG. 5A, the first cavity 111 is located on the left side of the second cavity 112, and the air inlet and the air outlet of the sealing air duct 150 are arranged on the right side of the power conversion circuit 130. That is, the sealing air duct 150 is arranged on the substrate of the second heatsink 142 and located on the right side of the second heatsink 142. As shown in FIG. 5B, the sealing air duct 150 is located on the left side of the second heatsink 142. As shown in FIG. 5C, the sealing air duct 150 is located in the middle of the second heatsink 142.

As shown in FIG. 6A, the first cavity 111 is located on the right side of the second cavity 112, and the air inlet and the air outlet of the sealing air duct 150 are arranged on the right side of the power conversion circuit 130. That is, the sealing air duct 150 is arranged on the substrate of the second heatsink 142 and is located on the right side of the second heatsink 142. As shown in FIG. 6B, the sealing air duct 150 is located on the left side of the second heatsink 142. As shown in FIG. 6C, the sealing air duct 150 is located in the middle of the second heatsink 142.

Figure 7A:
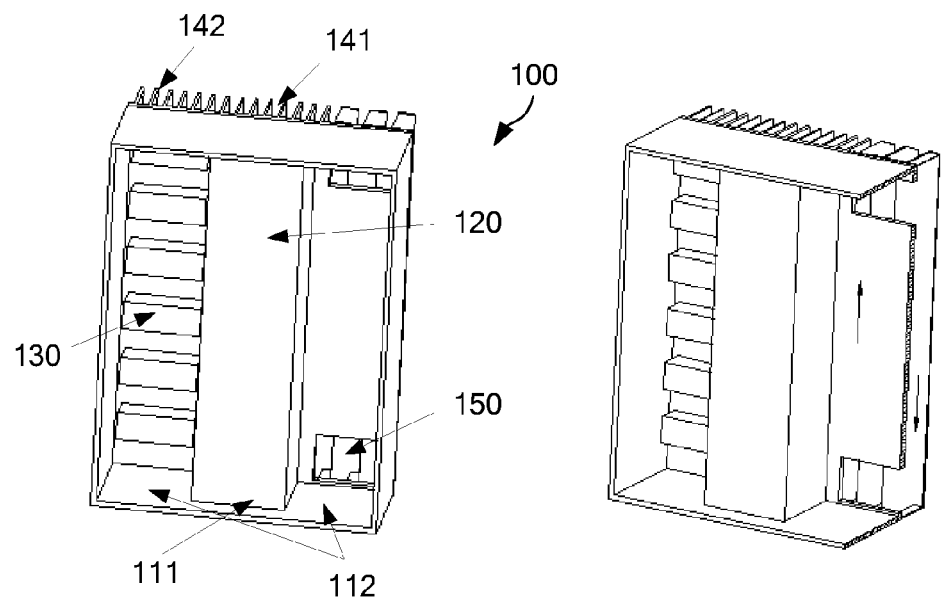
FIG. 7A to FIG. 7D are schematic perspective diagrams of an inverter according to another embodiment of the present invention.
Figure 7B:
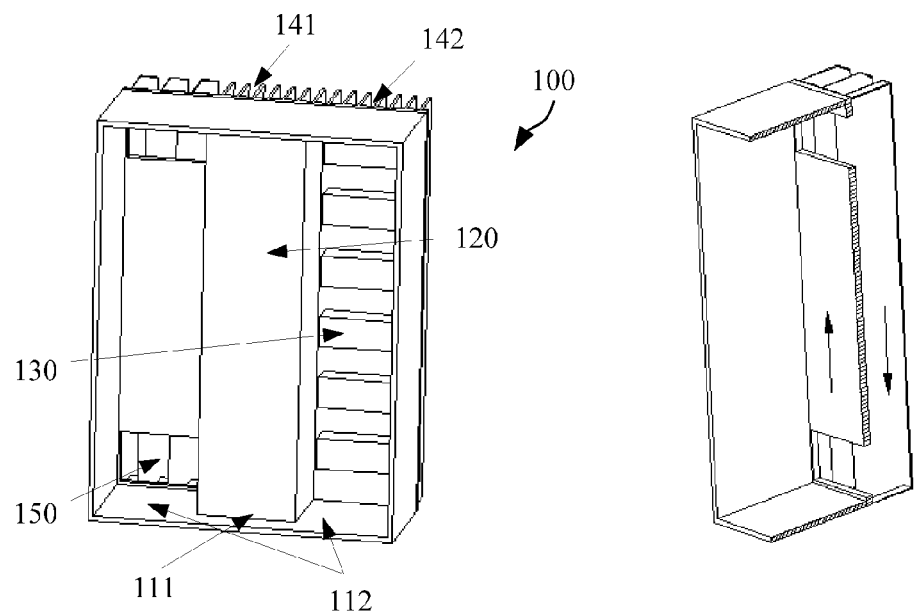
Figure 7C:
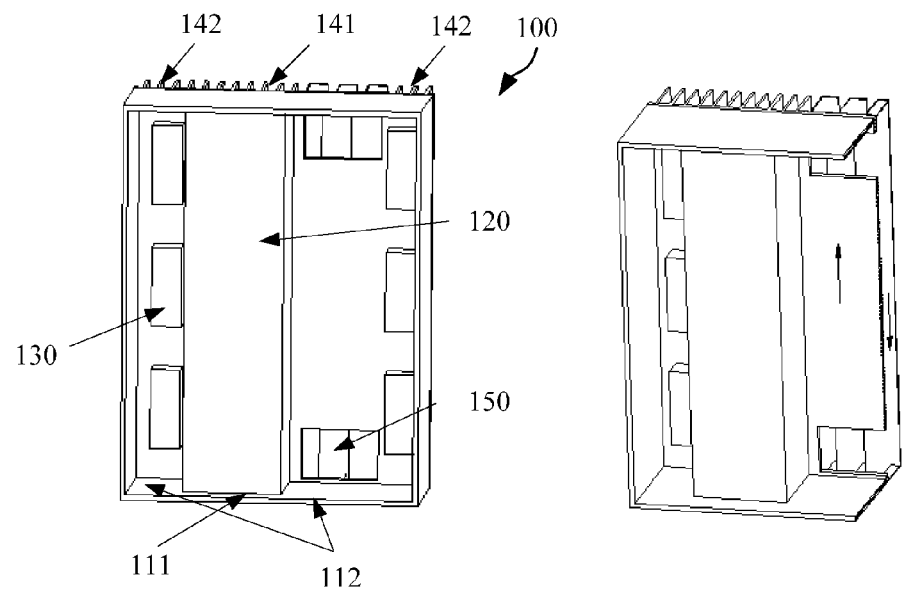
Figure 7D:
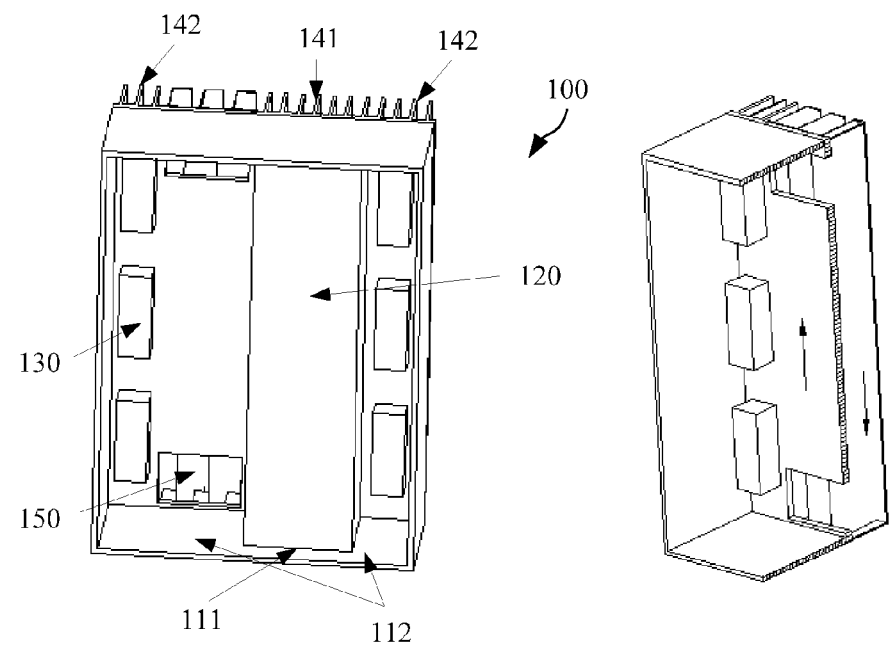

As shown in FIG. 7A, the first cavity 111 is located in the middle of the second cavity 112, and the air inlet and the air outlet of the sealing air duct 150 are arranged on the right side of the power conversion circuit 130. That is, the sealing air duct 150 is arranged on the substrate of the second heatsink 142 and is located on the right side of the second heatsink 142. As shown in FIG. 7B, the sealing air duct 150 is located on the left side of the second heatsink 142. As shown in FIG. 7C and FIG. 7D, the sealing air duct 150 is located in the middle of the second heatsink 142.

Figure 8:
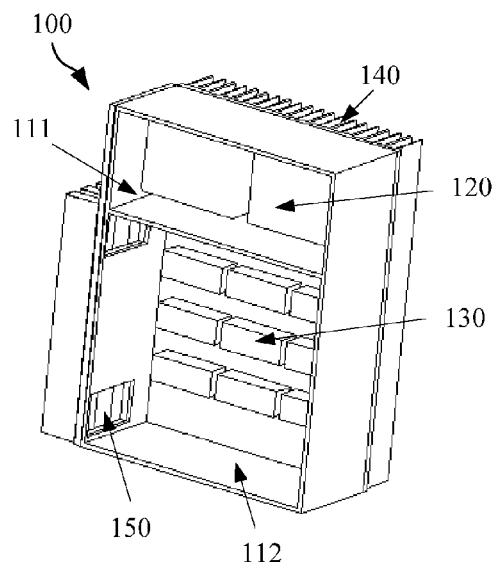
FIG. 8 is a schematic perspective diagram of an inverter according to an embodiment of the present invention.

In the embodiments of the present invention, alternatively, the sealing air duct is located on a lateral wall of the second cavity. As shown in FIG. 8, the sealing air duct 150 is arranged outside the second cavity 112 and is located on the lateral wall of the second cavity 112. In this case, the bottom surface of the sealing air duct 150 is formed by the lateral wall of the second cavity 112, and the bottom surface includes an air inlet and an air outlet to communicate the second cavity with the at least one columnar pipeline.

In the embodiments of the present invention, alternatively, the heat dissipation surface is integratedly formed by an alumina plate. The manufacture is simple, the product costs are reduced and the product efficiency is improved. In the embodiments of the present invention, the heat dissipation surface is sealingly connected to the lateral wall of the second cavity or the substrate of the second heatsink. Alternatively, the sealing air duct is sealed using at least one of the metal mechanical part sealing mode and the plastic parts sealing mode.

Specifically, regarding the heat dissipation surface of a main heat dissipation device in the sealing air duct, the heat dissipation surface may also be a wrinkled plate, where sealing is critical. For isolation of the sealing air duct from the inner and outer walls of the enclosure, the following sealing solution may be used: multiple sealing is used to implement complete sealing; sealing is implemented on the two ends of the wrinkled plate using the sealing structure mode and the impregnation mode; and sealing is implemented at the joint of the wrinkled plate and cabinet using sealing materials with application of specific installation pressure. The sealing solution is characterized in that the wrinkled plate implements first compression sealing using the edge materials at the end parts, implements second sealing using the tooth-shaped mechanical part and the riveting method, and finally implements third sealing using impregnation, achieving an effect of complete sealing.

Figures 9A, 9B:
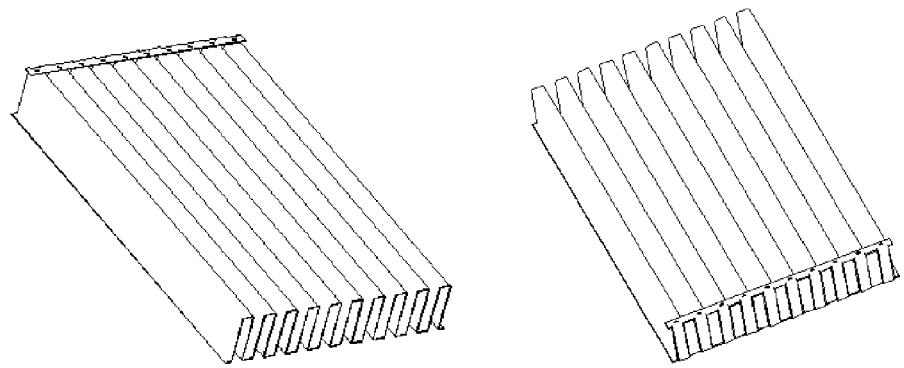
FIG. 9A and FIG. 9B are schematic perspective diagrams of a heat dissipation surface according to an embodiment of the present invention.

The implementation mode of sealing may include the following forms:

(1) Metal mechanical part sealing:

As shown in FIG. 9A, after the wrinkled plate is formed, 90-degree flanging is performed for two ends, the flanging scale is determined by the spacing of the wrinkles, and two flanges butt against each other or overlay to implement first sealing. As shown in FIG. 9B, a comb-shaped structure having the same shape as the cross-section of the wrinkles or another connection mode is used at the two ends of the wrinkled plate to implement sealing. Finally, final sealing of the wrinkled plate is implemented using the impregnation mode.

(2) Plastic mechanical part sealing:

The sealing mode is characterized in that: The wrinkled plate implements sealing using plastic parts at the end parts. To be specific, a plastic sealing header part is prepared first, then the sealing header part on the formed wrinkled plate, and finally implements sealing using the impregnation mode.

Therefore, according to the inverter provided in the embodiments of the present invention, a sealing air duct having an air inlet and an air outlet is arranged outside a sealed cavity so that the hot air inside the sealed second cavity enters the sealing air duct and exchanges heat with external air through the sealing air duct and the heat dissipation surface, thereby reducing the air temperature inside the second cavity, improving the heat dissipation efficiency, enhancing the reliability and life cycle of the devices, reducing product size and weight, and reducing the product noise.

The above, with reference to FIG. 1A to FIG. 9B, describes the inverter according to the embodiments of the present invention in detail. The following, with reference to FIG. 10 and FIG. 11, describes a sealing air duct and a heat dissipation system according to the embodiments of the present invention.

Figure 10:
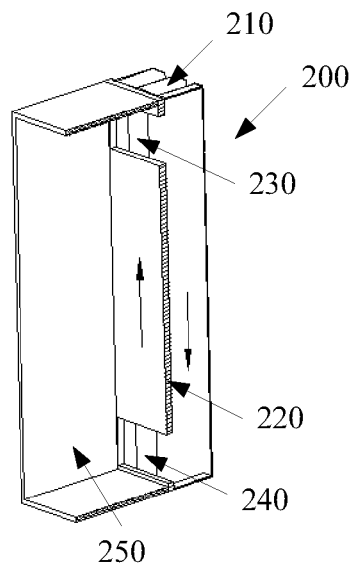
FIG. 10 is a schematic perspective diagram of a sealing air duct according to an embodiment of the present invention.

FIG. 10 is a schematic perspective diagram of a sealing air duct 200 according to an embodiment of the present invention. As shown in FIG. 10, the sealing air duct 200 is arranged outside a sealed cavity 250. The sealing air duct 200 includes at least one columnar pipeline formed by a heat dissipation surface 210 and a bottom surface 220, where the at least one columnar pipeline is sealed at two ends, the bottom surface 220 is formed by the wall of the sealed cavity, and the bottom surface 220 includes an air inlet 230 and an air outlet 240 to communicate with the cavity 250 and the at least one columnar pipeline.

According to the sealing air duct provided in the embodiments of the present invention, a sealing air duct having an air inlet and an air outlet is arranged outside a sealed cavity so that the hot air inside the sealed cavity enters the sealing air duct and exchanges heat with external air through the heat dissipation surface of the sealing air duct, thereby reducing the air temperature inside the second cavity, improving the heat dissipation efficiency, enhancing the reliability and life cycle of the devices, reducing product size and weight, and reducing the product noise.

In the embodiments of the present invention, alternatively, the cross-section of the heat dissipation surface may be a boss shape, a sawtooth shape or a ripple wave shape. The outer surface of the heat dissipation surface may have a boss-shaped or a ripple wave-shaped enhanced surface. The heat dissipation surface and the material for enhancing the heat dissipation surface may be metal or non-metal. Alternatively, the heat dissipation surface is integratedly formed by an alumina plate.

In the embodiments of the present invention, alternatively, the heat dissipation surface is sealingly connected to the wall of the sealed cavity. Alternatively, the sealing air duct is sealed using at least one of the metal mechanical part sealing mode and the plastic parts sealing mode.

The sealing air duct 200 according to the embodiments of the present invention may correspond to the sealing air duct 150 in the inverter according to the embodiments of the present invention. In addition, the above and other operations and/or functions of the modules in the sealing air duct 200 may be referred to the description in the above embodiments. For brevity, the details are not given here again.

According to the sealing air duct provided in the embodiments of the present invention, a sealing air duct having an air inlet and an air outlet is arranged outside a sealed cavity so that the hot air inside the sealed cavity enters the sealing air duct and exchanges heat with external air through the heat dissipation surface of the sealing air duct, thereby reducing the air temperature inside the second cavity, improving the heat dissipation efficiency, enhancing the reliability and life cycle of the devices, reducing product size and weight, and reducing the product noise.

Figure 11:
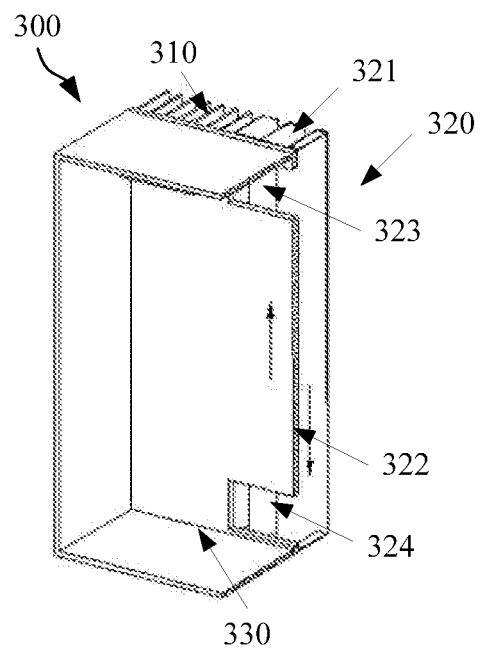
FIG. 11 is a schematic perspective diagram of a heat dissipation system according to an embodiment of the present invention.

FIG. 11 is a schematic perspective diagram of a heat dissipation system 300 according to an embodiment of the present invention. As shown in FIG. 11, the heat dissipation system 300 includes: a heatsink 310 arranged at the bottom of a sealed cavity 330 and located outside the sealed cavity 330; and a sealing air duct 320 according to an embodiment of the present invention; where the sealing air duct 320 is arranged outside a sealed cavity 320; the sealing air duct 320 includes at least one columnar pipeline formed by a heat dissipation surface 321 and a bottom surface 322, where the at least one columnar pipeline is sealed at two ends, the bottom surface 322 is formed by the wall of the sealed cavity 330, and the bottom surface 322 includes an air inlet 323 and an air outlet 324 to communicate with the cavity 330 and the at least one columnar pipeline.

In the embodiments of the present invention, the heat dissipation system may also include a first fan arranged inside the sealed cavity and/or a second fan arranged outside the sealed cavity. Alternatively, the sealing air duct is arranged on the lateral wall of the sealed cavity; or arranged at the bottom of the sealed cavity and arranged on the left side, in the middle or on the right side of the heatsink.

It should be understood that the sealing air duct 320 included in the heat dissipation system 300 according to the embodiments of the present invention may correspond to the sealing air duct 150 or the sealing air duct 200 in the inverter 100 according to the embodiments of the present invention. In addition, the above and other operations and/or functions of the modules in the sealing air duct 320 may be referred to the description in the above embodiments. For brevity, the details are not given here again.

In the heat dissipation system according to the embodiments of the present invention, a sealing air duct having an air inlet and an air outlet is arranged outside a sealed cavity so that the hot air inside the sealed cavity enters the sealing air duct and exchanges heat with outside air through the heat dissipation surface of the sealing air duct, thereby reducing the air temperature inside the second cavity, improving the heat dissipation efficiency, enhancing the reliability and life cycle of the devices, reducing product size and weight, and reducing the product noise.

Persons of ordinary skill in the art may appreciate that, in combination with the examples described in the embodiments herein, units and algorithm steps can be implemented by electronic hardware, computer software, or a combination thereof. In order to clearly describe the interchangeability between the hardware and the software, compositions and steps of every embodiment have been generally described according to functions in the foregoing description. Whether these functions are performed using hardware or software depends on particular applications and design constraints of the technical solutions. A person skilled in the art may use different methods to implement the described functions for each specific application. However, such implementation should not be considered as beyond the scope of the present invention.

A person skilled in the art may clearly understand that, for the sake of convenience and brevity in description, the specific working process of the system, devices, and units described above may refer to the process in the method embodiment described above and is not repeatedly described herein.

In the embodiments provided in the present application, it should be understood that the disclosed system, device, and method may be implemented in other modes. For example, the described device embodiments are merely exemplary. For example, the unit division is merely logical function division and can be other division in actual implementation. For example, multiple units or components can be combined or integrated into another system, or some features can be ignored or not performed. In addition, the displayed or discussed mutual couplings or direct couplings or communication connections may be implemented via some interfaces, and the indirect couplings or communication connections between devices or units may be may be implemented in electronic, mechanical, or other forms.

The units described as separate parts may or may not be physically separate, and parts displayed as units may or may not be physical units, may be located in one position, or may be distributed on multiple network elements. A part or all of the units herein may be selected according to actual requirements to achieve the purpose of embodiments of the present invention.

In addition, the functional units in embodiments of the present invention may be integrated in one processing unit, or may separately and physically exist as units, or two or more units may be integrated in one unit. The integrated unit may be implemented in a form of hardware, or may be implemented in a form of a software functional unit.

What is claimed is:

1. An inverter, comprising:
an enclosure having a first cavity and a second cavity that are isolated from each other and sealed;
a magnetic conversion circuit comprising magnetic elements that are arranged in the first cavity;
a power conversion circuit comprising power tubes that are arranged in the second cavity;
a heatsink arranged at the bottom of the enclosure and located outside the first cavity and the second cavity;
a sealing air duct arranged outside the second cavity,
wherein the sealing air duct comprises at least one columnar pipeline formed by a heat dissipation surface and a bottom surface,
wherein the at least one columnar pipeline is sealed at two ends,
wherein the bottom surface is formed by a side wall of the second cavity or a substrate of the heatsink, and wherein the bottom surface comprises an air inlet and an air outlet to communicate with the second cavity and the at least one columnar pipeline.

2. The inverter according to claim 1, wherein the heatsink comprises:
a first heatsink located outside the first cavity; and
a second heatsink located outside the second cavity,
wherein radiation fins of the first heatsink are isolated from radiation fins of the second heatsink.

3. The inverter according to claim 2, wherein the magnetic conversion circuit is set to a substrate tightly adhering to the first heatsink, and wherein the power conversion circuit is set to a substrate tightly adhering to the second heatsink.

4. The inverter according to claim 1, further comprising:
a first fan arranged inside the second cavity; and/or
a second fan arranged outside the enclosure.

5. The inverter according to claim 1, further comprising a heat shield, wherein the heat shield is made of thermal insulation materials and is placed above the magnetic conversion circuit.

6. The inverter according to claim 1, wherein the first cavity is located above, on the left side, on the right side, or in the middle of the second cavity.

7. The inverter according to claim 2, wherein the sealing air duct is located on a lateral wall of the second cavity, or wherein the sealing air duct is arranged on the substrate of the second heatsink and is located on the left side, in the middle, or on the right side of the second heatsink.

8. The inverter according to claim 1, wherein the cross-section of the heat dissipation surface comprises a boss shape, a sawtooth shape, or a ripple wave shape.

9. The inverter according to claim 1, wherein the heat dissipation surface is formed at least in part by an alumina plate.

10. The inverter according to claim 2, wherein the heat dissipation surface is sealingly connected to a lateral wall of the second cavity or the substrate of the second heatsink.

11. The inverter according to claim 1, wherein the sealing air duct is sealed using at least one of a metal mechanical part sealing mode and a plastic parts sealing mode.

12. The inverter according to claim 1, wherein the magnetic elements comprise a boost inductor or an inverter inductor, and wherein the power tubes comprise a boost power tube or an inverter power tube.

* * * * *

UNITED STATES PATENT AND TRADEMARK OFFICE
CERTIFICATE OF CORRECTION

| | | |
|---|---|---|
| PATENT NO. | : 9,167,729 B2 | Page 1 of 1 |
| APPLICATION NO. | : 14/012659 | |
| DATED | : October 20, 2015 | |
| INVENTOR(S) | : Xiaohu Liu | |

It is certified that error appears in the above-identified patent and that said Letters Patent is hereby corrected as shown below:

On the title page item (30), Foreign Application Priority Data should read:

Oct. 18 2011   (CN) .................................................. 201110316799.1

Signed and Sealed this
Tenth Day of May, 2016

Michelle K. Lee
*Director of the United States Patent and Trademark Office*